(12) United States Patent
Kakamu et al.

(10) Patent No.: US 7,030,498 B2
(45) Date of Patent: Apr. 18, 2006

(54) SEMICONDUCTOR DEVICE WITH COPPER WIRINGS HAVING IMPROVED NEGATIVE BIAS TEMPERATURE INSTABILITY (NBTI)

(75) Inventors: Katsumi Kakamu, Kasugai (JP); Yoshihiro Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/943,910

(22) Filed: Sep. 20, 2004

(65) Prior Publication Data

US 2005/0029671 A1 Feb. 10, 2005

Related U.S. Application Data

(62) Division of application No. 10/265,764, filed on Oct. 8, 2002, now Pat. No. 6,885,105.

(30) Foreign Application Priority Data

Mar. 28, 2002 (JP) .............................. 2002-091306

(51) Int. Cl.
*H01L 27/108* (2006.01)
*H01L 21/00* (2006.01)
*H01L 27/10* (2006.01)
*H01L 23/52* (2006.01)

(52) U.S. Cl. ............... 257/774; 257/758; 257/760; 257/751; 257/351; 257/228; 257/369; 257/374; 257/395; 257/396; 257/397; 257/398; 257/412; 257/413; 257/408

(58) Field of Classification Search ............... 257/758, 257/760, 751, 774, 351, 228, 369, 374, 395–398, 257/412, 413, 408; 438/396, 199, 585, 785
See application file for complete search history.

(56) References Cited

U.S. PATENT DOCUMENTS

| | | | |
|---|---|---|---|
| 6,054,355 A * | 4/2000 | Inumiya et al. ............. 438/296 |
| 6,369,446 B1 * | 4/2002 | Tanaka ........................ 257/758 |
| 6,492,222 B1 | 12/2002 | Xing ........................... 438/240 |
| 6,787,446 B1 * | 9/2004 | Enomoto et al. ........... 438/623 |
| 2001/0044202 A1 | 11/2001 | Huang et al. ................ 438/627 |
| 2002/0105089 A1 * | 8/2002 | Tanaka ........................ 257/774 |
| 2002/0155662 A1 * | 10/2002 | Asano et al. ................ 438/253 |
| 2003/0030084 A1 | 2/2003 | Moise et al. ................. 257/295 |
| 2003/0045039 A1 * | 3/2003 | Shin et al. ................... 438/197 |
| 2003/0129771 A1 * | 7/2003 | Summerfelt et al. ........... 438/3 |
| 2003/0201497 A1 | 10/2003 | Inoue et al. ................. 257/351 |
| 2003/0214043 A1 | 11/2003 | Saitoh et al. ................ 257/758 |
| 2003/0216022 A1 | 11/2003 | Mayzumi ..................... 438/595 |
| 2005/0026350 A1 * | 2/2005 | Rudeck ....................... 438/222 |
| 2005/0062115 A1 * | 3/2005 | Ohtake et al. ............... 257/412 |

FOREIGN PATENT DOCUMENTS

| | | |
|---|---|---|
| CN | 1233073 | 10/1999 |
| FR | 2 794 286 | 12/2000 |
| JP | 2001-257262 | 9/2001 |
| JP | 2002-57305 | 2/2002 |
| WO | WO 01/66832 A2 | 9/2001 |

* cited by examiner

*Primary Examiner*—Alexander Oscar Williams
(74) *Attorney, Agent, or Firm*—Westerman, Hattori, Daniels & Adrian, LLP (57) ABSTRACT

A semiconductor device with p-channel MOS transistor having: a gate insulating film of nitrogen-containing silicon oxide; a gate electrode of boron-containing silicon; side wall spacers on side walls of the gate electrode, comprising silicon oxide; an interlayer insulating film having a planarized surface; a wiring trench and a contact via hole formed in the interlayer insulating film; a copper wiring pattern including an underlying barrier layer and an upper level copper region, and filled in the wiring trench; and a silicon carbide layer covering the copper wiring pattern. A semiconductor device has the transistor structure capable of suppressing NBTI deterioration.

10 Claims, 10 Drawing Sheets

| | 26 |
|---|---|
| sn1 | TaN |
| sn2 | Ta |
| sn3 | Ti+TiN+TaN |

SEMICONDUCTOR DEVICE WITH COPPER WIRINGS HAVING IMPROVED NEGATIVE BIAS TEMPERATURE INSTABILITY (NBTI)

CROSS REFERENCE TO RELATED APPLICATION

This application is a divisional of application Ser. No. 10/265,764 filed Oct. 8, 2002, now U.S. Pat. No. 6,885,105 which is hereby incorporated by reference in its entirety.

This application is based on Japanese Patent Application No. 2002-091306, filed on Mar. 28, 2002, the entire contents of which are incorporated herein by reference.

BACKGROUND OF THE INVENTION

A) Field of the Invention

The present invention relates to a semiconductor device, and more particularly to a semiconductor device with copper wirings.

B) Description of the Related Art

In order to realize high speed operation and low power consumption of LSI circuits, device elements are made fine, and drive voltage and resistance of wiring are reduced. In order to lower the resistance of wiring, Cu wiring having a lower resistivity than conventionally used Al wiring is adopted. Fine patterning of a Cu layer is difficult so that a damascene structure is often adopted. For fine device elements and low power consumption, it is desired to realize a high speed operation of transistor at a low voltage. To this end, a gate insulating film is made substantially thin.

A diffusion speed of Cu in a silicon oxide film as an interlayer insulating film is very high. As Cu diffuses in the interlayer insulating film, the transistor characteristics are degraded. If Cu is used as the material of wiring, it is necessary to dispose a diffusion prevention film around Cu wiring. An oxide film hardly suppresses Cu diffusion.

A Cu wiring layer is deposited in a trench (and/or a via hole) formed through a silicon oxide film and exposing a lower wiring layer or lower conductive layer. In this case, a barrier metal layer and a CU wiring layer are stacked, the barrier metal layer having a function of preventing Cu diffusion. Since the barrier metal layer is disposed between the Cu wiring layer and silicon oxide film, Cu can be prevented from being diffused into the silicon oxide film. The Cu wiring layer deposited on the silicon oxide film is removed by chemical mechanical polishing (CMP) or the like. If an upper silicon oxide layer is deposited on this substrate, Cu of the exposed wiring layer diffuses into the upper silicon oxide layer. A silicon nitride film as an insulating member having a function of Cu diffusion prevention is formed covering the damascene Cu wiring layer.

A silicon oxide film is widely used as a gate insulating film. If a gate oxide film is thinned, direct tunneling current flowing through the gate oxide film increases, i.e., gate leak current increases. In order to reduce the gate leak current, a physical thickness of the gate insulating film is increased.

In order to thicken the gate insulating film and realize a transistor drive capability similar to a thinned gate insulating film, it is necessary to use a high dielectric constant insulator as the material of a gate insulating film. As the dielectric constant of a gate insulating film is made high, it is possible to increase the physical thickness of the film and form an electrically thinned gate insulating film. Both suppressing gate leak current and improving a transistor drive ability can therefore be realized.

In a surface channel type p-channel transistor, if boron impurities in the gate electrode diffuse into the gate insulating film and reach the channel region, the transistor characteristics are degraded.

In order to alleviate this problem, technique of doping nitrogen in a gate insulating film has been adopted. If the nitrogen concentration in the gate insulating film is made too high, the nitrogen concentration at the interface between the gate insulating film and semiconductor substrate becomes high so that the motion of electrons/holes flowing in a channel formed in the substrate surface layer is hindered.

The phenomenon that drain current flowing through the transistor is deteriorated is called negative bias temperature instability (NBTI). This deterioration appears as reduced drain current when a p-channel MOS transistor is subjected to an accelerated test at a raised temperature by applying a negative voltage to the gate. Drain current deterioration $\Delta$Ids per stress time of copper wiring is larger than aluminum wiring.

Even if a gate insulating film is made thick to lower direct tunneling current, the NBTI deterioration poses a problem. If the nitrogen concentration in a gate insulating film is increased, the NBTI deterioration increases.

Many problems occur if a gate insulating film is made thin in order to improve the operation characteristics of LSI. A novel transistor structure capable of solving these problems has been desired.

SUMMARY OF THE INVENTION

An object of this invention is to provide a semiconductor device having a transistor structure capable of suppressing NBTI deterioration.

Another object of the invention is to provide a semiconductor device having a transistor structure realizing a small gate leak current and presenting excellent transistor characteristics.

A further object of the invention is to provide a semiconductor device having fine transistors excellent in their characteristics.

According to one aspect of the present invention, there is provided a semiconductor device comprising: a silicon substrate having an n-type region; a gate insulating film formed on the n-type region, the gate insulating film being made of nitrogen-containing silicon oxide; a gate electrode formed on the gate insulating film, the gate electrode being made of boron-containing silicon; p-type source/drain regions formed in a surface layer of the silicon substrate on both sides of the gate electrode; side wall spacers formed on side walls of the gate electrode, the side wall spacer being made of silicon oxide; an interlayer insulating film having a planarized surface and covering the gate electrode and side wall spacers; a wiring trench formed in the interlayer insulating film from the planarized surface to an inside thereof; a copper wiring pattern including an underlying barrier layer and an upper level copper region, the copper wiring pattern being filled in the wiring trench; and a silicon carbide layer formed on the interlayer insulating film and covering the copper wiring pattern.

According to another aspect of the invention, there is provided a semiconductor device comprising: a silicon substrate having an n-type region; a gate insulating film formed on the n-type region, the gate insulating film being made of nitrogen-containing silicon oxide; a gate electrode formed on the gate insulating film, the gate electrode being made of boron-containing silicon; p-type source/drain regions formed in a surface layer of the silicon substrate on both sides of the gate electrode; side wall spacers formed on side walls of the gate electrode, the side wall spacer being made of a lamination of a silicon oxide layer and a silicon nitride layer; an interlayer insulating film having a planarized surface and covering the gate electrode and side wall spacers; a wiring trench formed in the interlayer insulating film from the planarized surface to an inside thereof; and a copper wiring pattern including an underlying barrier layer of Ta or Ti and an upper level copper region, the copper wiring pattern being filled in the wiring trench.

According to a further aspect of the present invention, there is provided a semiconductor device comprising: a silicon substrate having an n-type region; a gate insulating film formed on the n-type region, the gate insulating film being made of a lamination structure having two or more layers with different dielectric constants; a gate electrode formed on the gate insulating film, the gate electrode being made of boron-containing silicon; p-type source/drain regions formed in a surface layer of the silicon substrate on both sides of the gate electrode; an interlayer insulating film having a planarized surface and covering the gate electrode; a wiring trench formed in the interlayer insulating film from the planarized surface to an inside thereof; a copper wiring pattern filled in the wiring trench; and a copper diffusion prevention insulating film not containing nitrogen formed on an upper or lower surface of the copper wiring pattern.

With such arrangements, semiconductor devices with suppressed NBTI deterioration can be provided.

DESCRIPTION OF THE PREFERRED EMBODIMENTS

First, the experiments made by the present inventors and their results will be described.

Figure 1A:
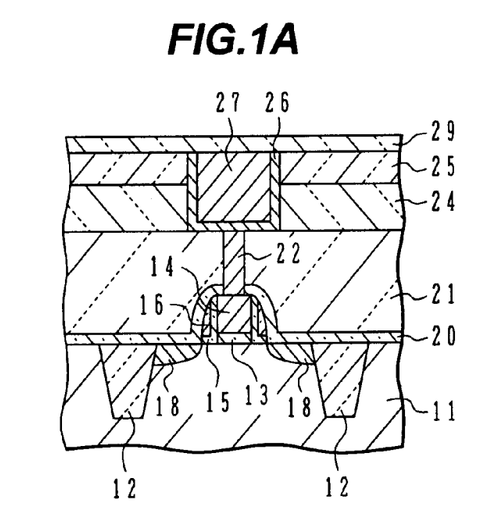
FIGS. 1A and 1B are cross sectional views showing the structures of samples used for experiments.

FIG. 1A is a cross sectional view showing the structure of a sample used for preliminary experiments. An etching mask of photoresist is formed on the surface of a silicon substrate 11, and the silicon substrate 11 is etched, for example, to a depth of 300 nm to form a trench. Burying the trench, a silicon oxide film is deposited to a thickness of, e.g., about 500 nm. The silicon oxide film on the surface of the silicon substrate 11 is removed by chemical mechanical polishing (CMP). A silicon oxide film 12 is left only in the trench to form shallow trench isolation (STI).

A resist pattern is formed having an opening corresponding to a well region, and $P^+$ ions are implanted into the silicon substrate 11 at an acceleration energy of 600 keV and at a dose of $3 \times 10^{13}$ cm$^{-2}$ to form an n-well.

A gate insulating film 13 of silicon oxide which contains 4 at % nitrogen is formed at least on the surface of the active region in the silicon substrate 11. The nitrogen concentration is not limited to 4 at %, but is preferably at least 1 at %. Lamination of a layer having nitrogen concentration of at least 1 at % and another layer having nitrogen concentration of less than 1 at % may also be employed. On this gate insulating film 13, a gate electrode layer 14 of polysilicon is formed.

After the gate electrode layer 14 is patterned, side wall spacers of a stacked layer of a silicon nitride film 15 and a silicon oxide film 16 are formed on the side walls of the gate electrode. For example, the silicon nitride film 15 is deposited to a thickness of about 20 nm by thermal CVD and then an undoped silicate glass layer 16 is deposited to a thickness of about 80 nm by CVD. The insulating films 16 and 15 on the flat surface are removed by reactive ion etching (RIE) to leave the silicon oxide film 16 and silicon nitride film 15 only on the side walls of the gate electrode 14.

Before the side wall spacers are formed or before and after they are formed, p-type impurity ions are implanted to form source/drain regions 18 doped with p-type impurities on both sides of the gate electrode 14.

A silicon nitride film 20 is deposited on the surface of the silicon substrate 11 by chemical vapor deposition (CVD). The silicon nitride film provides an etch stopper function relative to etching a silicon oxide film to be formed on the silicon nitride film. After the etch stopper film 20 is deposited, an interlayer insulating film 21 made of, e.g., phosphosilicate glass (PSG), is formed.

The surface of the interlayer insulating film 21 is planarized by CMP, reflow, etch-back or the like. A resist pattern having an opening for forming a contact hole is formed on the interlayer insulating film. A conductive plug 22 filled in the contact hole is formed. For example, a conductive lamination structure of Ti/TiN/W is used to form a W plug 22. The conductive lamination structure deposited on the surface of the interlayer insulating film 21 is removed by CMP or the like.

On the surface of the interlayer insulating film 21, a laminated interlayer insulating film is formed which is made of, for example, a low dielectric constant insulating film (e.g., trademark SiLK) film 24 of 150 nm in thickness and an undoped silicate glass (USG) layer 25 of 100 nm in thickness. The surface of the undoped silicate glass film 25 is planarized by CMP or the like.

From the planarized surface, a trench is formed through the interlayer insulating films 24 and 25. A barrier metal layer 26 and a copper layer 27 are deposited burying the trench. Unnecessary conductive layers on the surface of the interlayer insulating film 25 are removed by CMP or the like. For example, the barrier metal layer 26 is a TaN layer of 25 nm in thickness. Thereafter, a Cu diffusion prevention insulating layer 29 is formed. For example, the diffusion prevention layer 29 is an SiC or SiN layer having a thickness of about 70 nm.

The SiC layer is formed by plasma enhanced (PE)-CVD using tetramethylsilane ($Si(CH_3)_4$) and carbon dioxide ($CO_2$) as source gas. The SiN layer is formed by PE-CVD using silane ($SiH_4$) and ammonia ($NH_3$) as source gas. Hereinafter, the sample having the SiN diffusion prevention layer is represented by sn, and the sample having the SiC diffusion prevention layer is represented by sc.

Figure 1B:
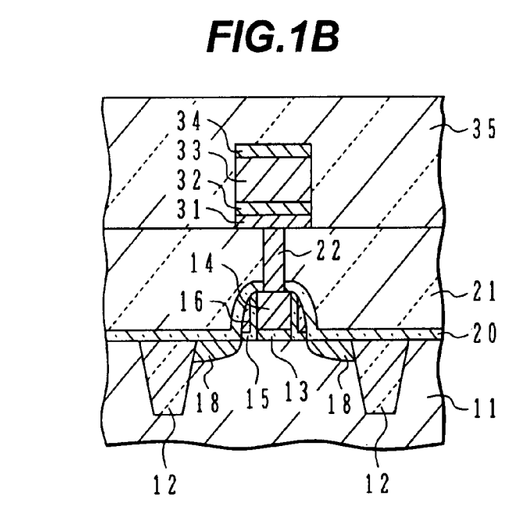

FIG. 1B shows an example of the structure of Al wiring. The structures of an interlayer insulating film 21 and a conductive plug 22 formed through the interlayer insulating film 21 are similar to those shown in FIG. 1A. On the interlayer insulating film 21, for example, a 40 nm thick Ti layer 31 of 40, a 30 nm thick TiN layer 32, a 100 nm thick Al wiring layer 33, and a 70 nm thick TiN layer are stacked and patterned by using a resist pattern to form a wiring structure. For example, an undoped silicate glass layer 35 is deposited covering the wiring structure, and the surface of the undoped silicate glass layer is planarized by CMP or the like.

Figure 1C:
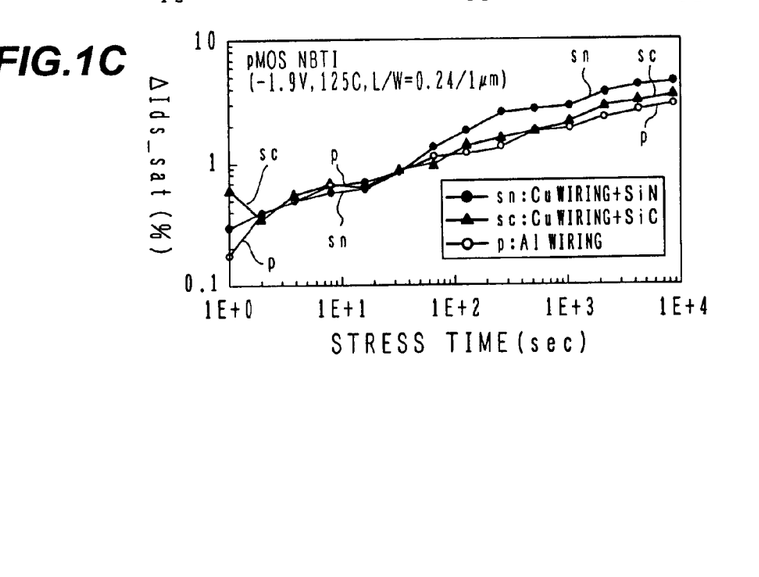
FIG. 1C is a graph showing measurement results of NBTI deterioration.

FIG. 1C is a graph showing the measurement results of NBTI deterioration of the structures shown in FIGS. 1A and 1B. In FIG. 1C, the abscissa represents stress time in the unit of second, and the ordinate represents deterioration $\Delta Ids\_sat$ of saturated drain current in the unit of %. The NBTI deterioration was measured under the conditions of a voltage of −1.9 V applied to the gate electrode, a temperature of 125° C. and a gate length L/gate width W of 0.24/1 μm.

A curve sn shows the measurement results of the structure using an SiN film as the Cu diffusion prevention film according to prior art. A curve sc shows the measurement results of the structure using an SiC film as the Cu diffusion prevention film. A curve p shows the measurement results of the structure using Al wiring according to prior art.

As seen from this graph, the characteristics sn using the SiN film as the diffusion prevention film show large NBTI deterioration. The characteristics sc show the NBTI deterioration approximately similar to those of the characteristics p using Al wiring which have posed conventionally no problem. The problem of the NBTI deterioration can be solved by the characteristics sc and p.

Namely, if a silicon oxide film which contains nitrogen is used as the gate insulating film and if an SiN film is used as the Cu diffusion prevention film after Cu wiring is formed, a problem of NBTI deterioration occurs, whereas if an SiC film is used as the Cu diffusion prevention film in place of the SiN film, the degree of NBTI deterioration is permissible.

In order to study the reason of NBTI deterioration, a sample was formed which had the structure that the diffusion prevention film of SiN was not formed after Cu wiring was formed.

Figure 2A:
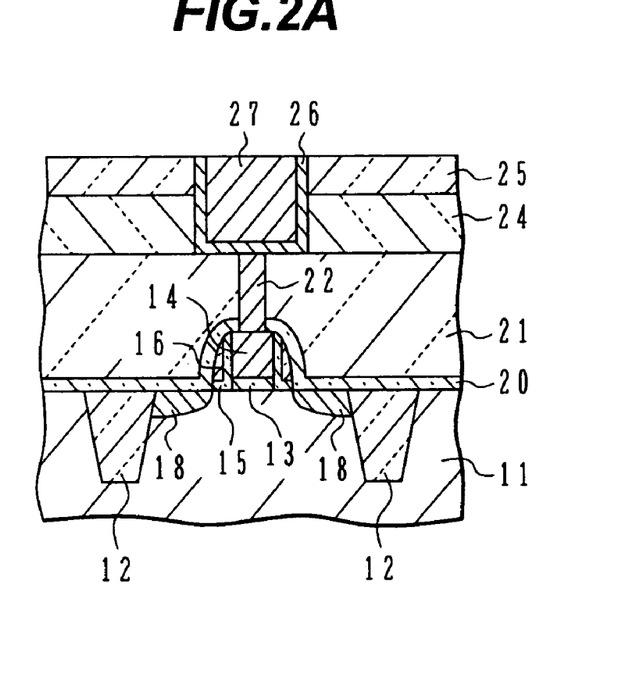
FIG. 2A is a cross sectional view showing the structure of samples used for experiments.
Figure 2B:
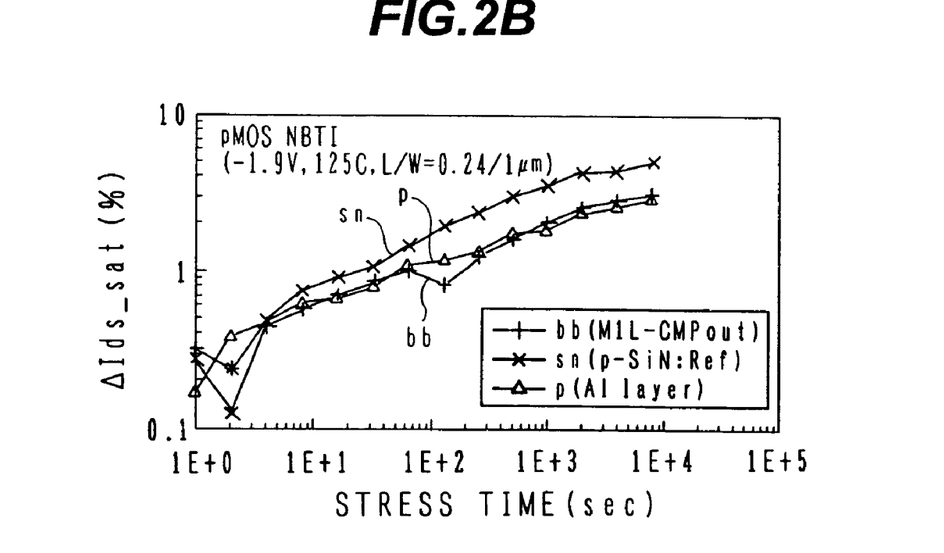
FIG. 2B is a graph showing measurement results of NBTI deterioration.

FIGS. 2A and 2B are a cross sectional view and a graph explaining experiments made for studying the reason of NBTI deterioration.

FIG. 2A is a schematic cross sectional view of the structure that the SiN layer 29 is not formed after Cu wiring is formed, which is different from the structure shown in FIG. 1A. The other structure is similar to that shown in FIG. 1A.

FIG. 2B shows the measured data of NBTI deterioration of the structure shown in FIG. 2A along with comparison data.

In FIG. 2B, the abscissa represents stress time in the unit of second, and the ordinate represents deterioration $\Delta Ids\_sat$ in the unit of %. A curve bb shows the characteristics of the structure that the diffusion prevention film of SiN is not formed after Cu wiring is formed. A curve p shows the structure using Al wiring. A curve sn shows the structure shown in FIG. 1A using the SiN layer as the Cu diffusion prevention layer.

As seen from the graph, the characteristics sn of the structure that the SiN film is formed as the Cu diffusion prevention film show large NBTI deterioration $\Delta Ids\_sat$. In contrast, the characteristics bb of the structure shown in FIG. 2A not forming the SiN film as the Cu diffusion prevention film show small NBTI deterioration which is in a permissible range, similar to the characteristics p of the Al wiring.

In the experiments described above, a TaN layer of about 25 nm in thickness was used as the conductive barrier metal layer for Cu wiring. A change in NBTI deterioration was studied by changing the material of the barrier metal.

Figure 3A:
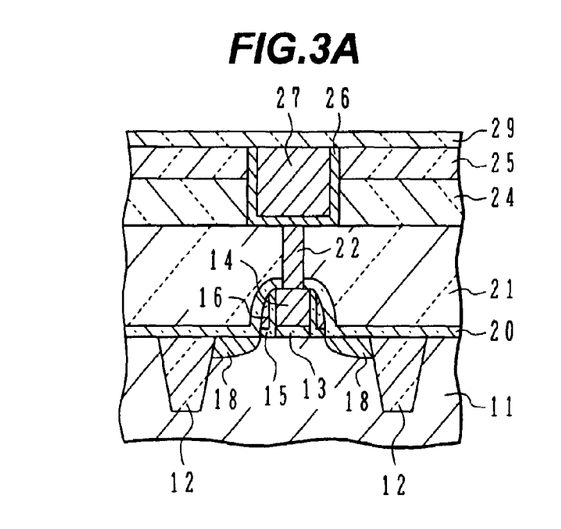
FIG. 3A is a cross sectional view showing the structure of samples used for experiments.
Figure 3B:
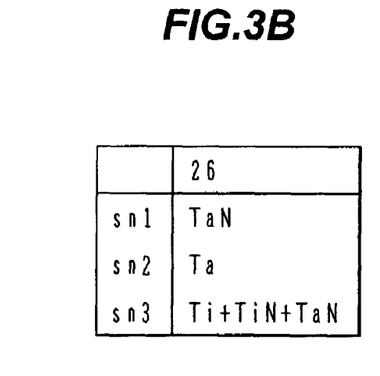
FIG. 3B shows examples of the material of barrier metal.

FIG. 3A is a schematic cross sectional view of the structure of samples. This structure is similar to that shown in FIG. 1A. The barrier metal layers 26 made of three different materials shown in FIG. 3B were used. Similar to the sample shown in FIG. 1A, samples sn1, sn2 and sn3 were formed. The sample sn1 has a TaN layer of 25 nm in thickness as the barrier metal layer 26. The sample sn2 has a pure Ta metal layer of 25 nm in thickness as the barrier metal layer. The sample sn3 has as the barrier metal layer a three-layer lamination structure of a pure Ti metal layer of 40 nm in thickness, a TiN layer of about 30 nm in thickness and a TaN layer of about 25 nm in thickness. The diffusion prevention layer on the Cu wiring is an SiN layer having a thickness of about 70 nm.

Figure 3C:
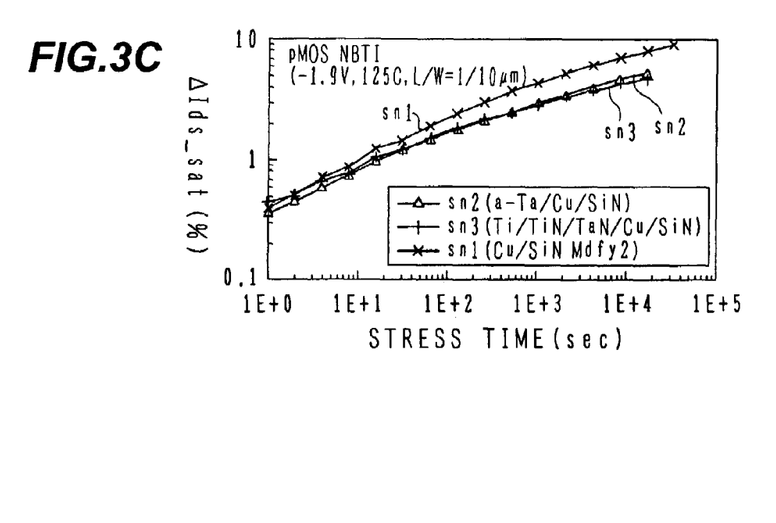
FIG. 3C is a graph showing measurement results of NBTI deterioration.

FIG. 3 shows the measurement results. While NBTI deterioration of the samples sn2 and sn3 is in a permissible range, the measurement results of the sample sn1 show NBTI deterioration not in the permissible range.

Namely, even if the SiN layer is used as the diffusion prevention layer, it is possible to suppress NBTI deterioration by using the barrier metal layer of pure Ta or Ti metal.

In the experiments described above, a lamination of an SiN layer having a thickness of about 20 nm and an undoped silicate glass layer having a thickness of about 80 nm was used as the side wall spacer. Influence of a single silicon oxide layer used as the side wall spacer was studied.

Figure 4A:
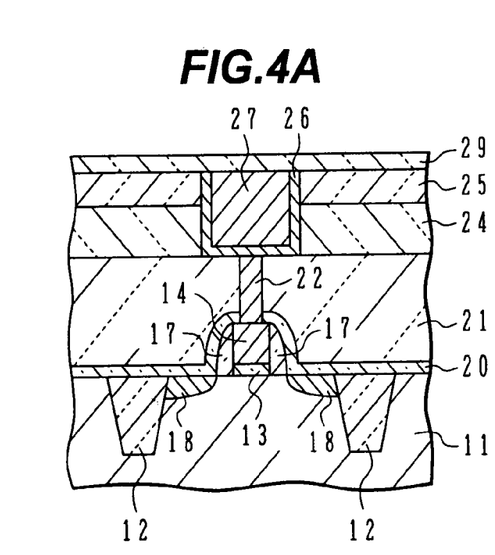
FIG. 4A is a cross sectional view showing the structure of samples used for experiments.

FIG. 4A is a schematic cross sectional view of samples. A side wall spacer 17 is made of undoped silicate glass of about 130 nm in thickness. A barrier metal layer 26 is made of a pure Ta metal layer of about 25 nm in thickness. A diffusion prevention layer 29 is made of an SiN layer of about 70 nm in thickness.

Figure 4B:
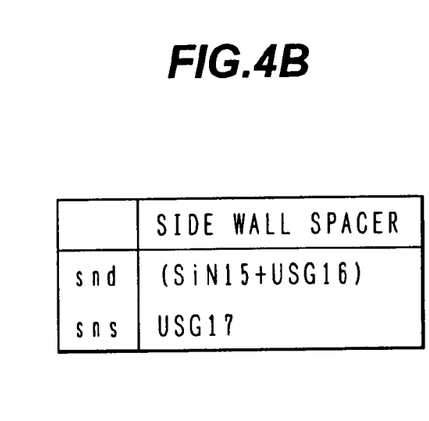
FIG. 4B shows examples of the material of side wall spacer.

Samples snd and sns having the side wall spacers made of the materials shown in FIG. 4B were used for measuring NBTI deterioration. The sample snd has a side wall spacer made of a lamination of an SiN layer 15 and an undoped silicate glass layer 16 such as shown in FIG. 1A and a barrier metal layer 26 made of a Ta layer of 25 nm in thickness. The sample sns has a side wall spacer made of a single undoped silicate glass layer 17 such as shown in FIG. 4A and a barrier metal layer 26 made of a Ta layer of 25 nm in thickness.

Figure 4C:
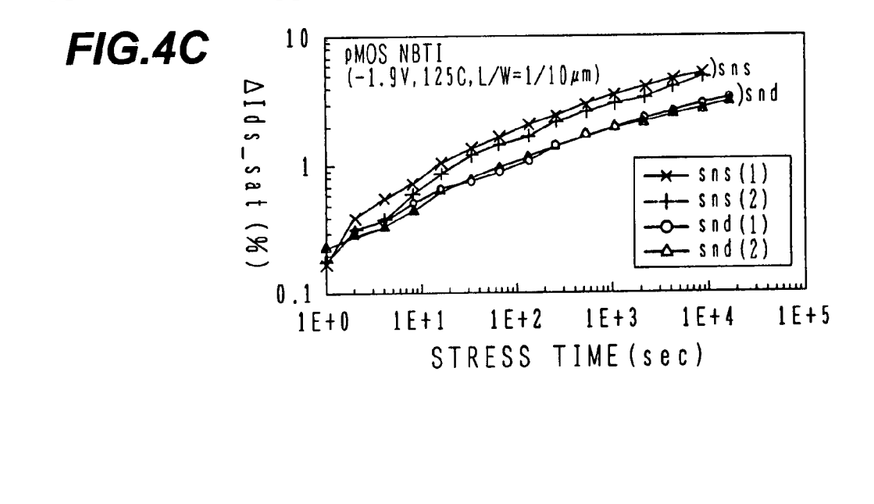
FIG. 4C is a graph showing measurement results of NBTI deterioration.

FIG. 4C shows the measurement results. The sample snd having a lamination structure of the SiN layer and undoped silicate glass layer as the side wall spacer can suppress NBTI deterioration in a permissible range.

The sample sns having a single undoped silicate glass layer 17 as the side wall spacer has large NBTI deterioration out of the permissible range.

It can be seen that even if pure Ta metal is used as the material of the barrier metal layer, there is NBTI deterioration if a single silicon oxide film is used as the side wall spacer.

In the experiments described above, NBTI deterioration occurs when the diffusion prevention layer of SiN is formed after Cu wiring is formed. The diffusion prevention layer of SiN is formed by plasma CVD (PCVD) using silane (SiH$_4$) and ammonia (NH$_3$) as source gas. A sample having an SiN layer formed by reducing the silane flow rate to a half was formed. The sample having an SiN layer formed by halving the silane flow rate is represented by snh.

Figure 5A:
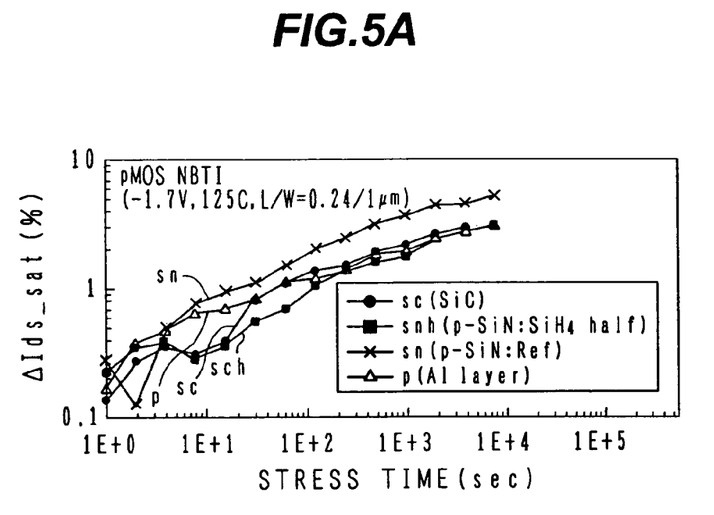
FIG. 5A is a graph showing measurement results of NBTI deterioration.

FIG. 5A shows the measurement results of a sample p using conventional Al wiring, a sample sn using a conventional SiN layer formed on Cu wiring, a sample snh using an SiN layer formed by halving the silane flow rate, and a sample sc using an SiC as the diffusion prevention layer.

For example, a Concept Two Sequel system of Novellus Systems provides SiH$_4$/NH$_3$ gas flow rate ratios of 1) (Standard) 11.1%, 2) (3/4) 7.7%, and 3) (1/2) 5.9% in forming an SiN film. An SiN film has been formed heretofore under the Standard condition. The condition of halving the silane flow rate described above corresponds to the SiH$_4$/NH$_3$ gas flow rate ratio of 6% or smaller.

It can be seen that while the sample sn using a standard SiN layer has large NBTI deterioration, the other three samples can suppress NBTI deterioration. It can be seen that if the SiN layer is formed by reducing the silane flow rate, NBTI deterioration can be suppressed.

Figure 5B:
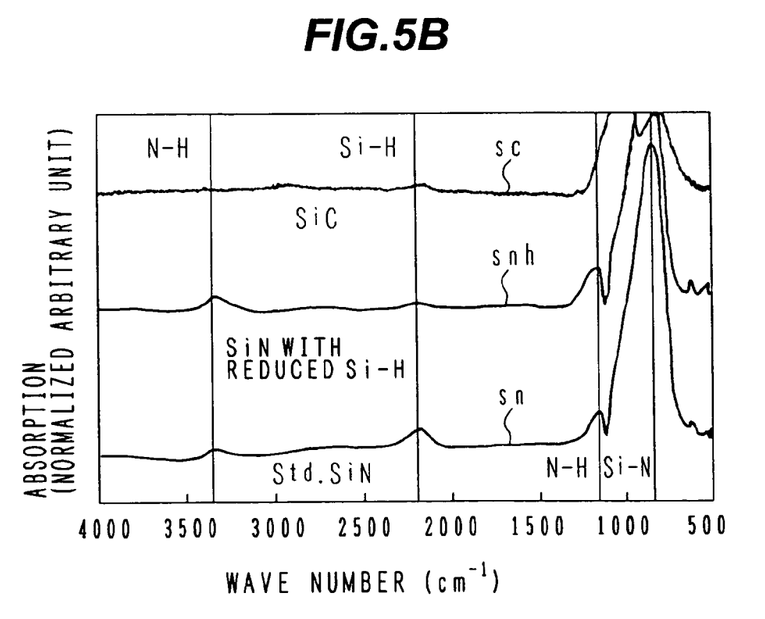
FIG. 5B is a graph showing measurement results of samples by Fourier-transform spectroscopy.

FIG. 5B shows measurement results of the diffusion prevention layers of the samples sc, snh and sn by Fourier-transform spectroscopy. In FIG. 5B, the abscissa represents a wave number in the unit of cm$^{-1}$ and the ordinate represents absorption in a normalized arbitrary unit. A peak at the wave number 2200 cm$^{-1}$ indicating absorption of Si—H is clear in the sample sn, and peaks are very small in the samples sc and snh.

A peak near at the wave number 3400 cm$^{-1}$ indicating absorption of N—H is most remarkable in the sample snh, somewhat weak in the sample sn, and cannot observed at all in the sample sc. It can be presumed from these results that NBTI deterioration is most probably influenced by the concentration of SI—H couplings. The SiN film formed by halving the silane flow rate has the characteristics apparently different from the characteristics of an SiN layer formed under the Standard condition.

It can be seen from the experiments described above that NBTI deterioration is likely to occur if the side wall spacer is made of a single undoped silicate glass layer. NBTI deterioration was studied under the conditions that the side wall spacer is made of a single silicon oxide layer and an SiC layer is used as the diffusion prevention layer.

Figure 6A:
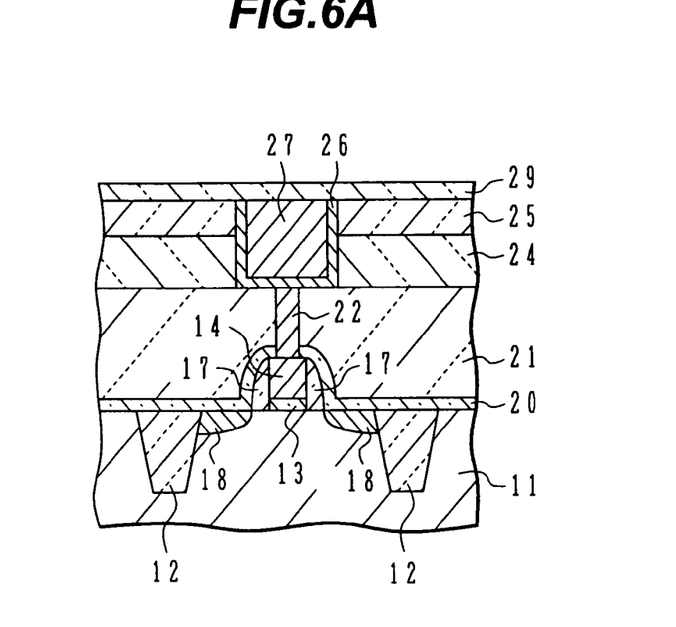
FIG. 6A is a cross sectional view showing the structure of samples used for experiments.

FIG. 6A is a schematic cross sectional view of a sample. This structure is similar to that shown in FIG. 4A. A Ta layer of about 25 nm in thickness was used as a barrier metal layer 26. An SiC layer of about 70 nm in thickness was used as a diffusion prevention layer 29. This sample is represented by sc.

Figure 6B:
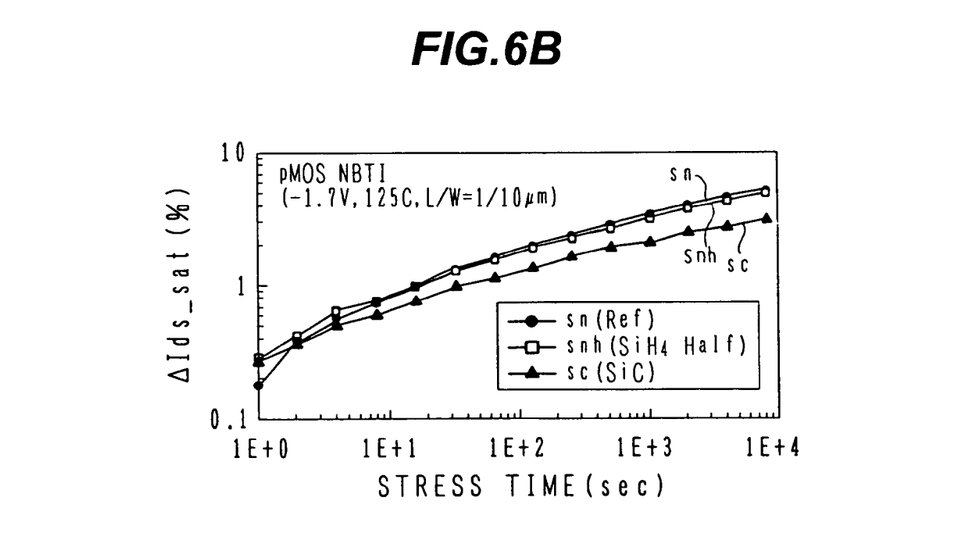
FIG. 6B is a graph showing measurement results of NBTI deterioration.

FIG. 6B shows the measurement results of both a sample sn having an SiN layer of about 70 nm in thickness as the diffusion prevention layer and a sample snh having an SiN layer with a halved silane flow rate. A sample sc using SiC as the material of the diffusion prevention layer suppresses NBTI deterioration even if the side wall spacer is made of a single silicon oxide layer.

The samples sn and snh using a standard SiN layer and an SiN layer with a reduced silane flow rate cannot suppress NBTI deterioration and the degree of NBTI deterioration is out of the permissible range. A combination of the SiN layer with a reduced silane flow rate and a lamination side wall spacer of a silicon nitride film and a silicon oxide film is effective for suppressing NBTI deterioration. However, if a single silicon oxide film is used as the side wall spacer, NBTI deterioration occurs.

From all the experiment results described above, the following conclusions can be made. If an SiC layer instead of an SiN layer is used as the diffusion prevention insulating layer, NBTI deterioration can be suppressed. Similar effects can be expected if a Cu diffusion prevention insulating layer not containing nitrogen is used in place of SiC.

NBTI deterioration can be suppressed by using Ta or Ti pure metal as the material of the barrier metal layer for Cu wiring if the side wall spacer is made of not a single silicone oxide layer but a lamination of a silicon nitride layer and a silicon oxide layer.

NBTI deterioration can be suppressed by using an SiN layer with a reduced silane flow rate as the diffusion prevention insulating layer if the side wall spacer is made of a lamination of a silicon nitride layer and a silicon oxide layer.

Figure 7:
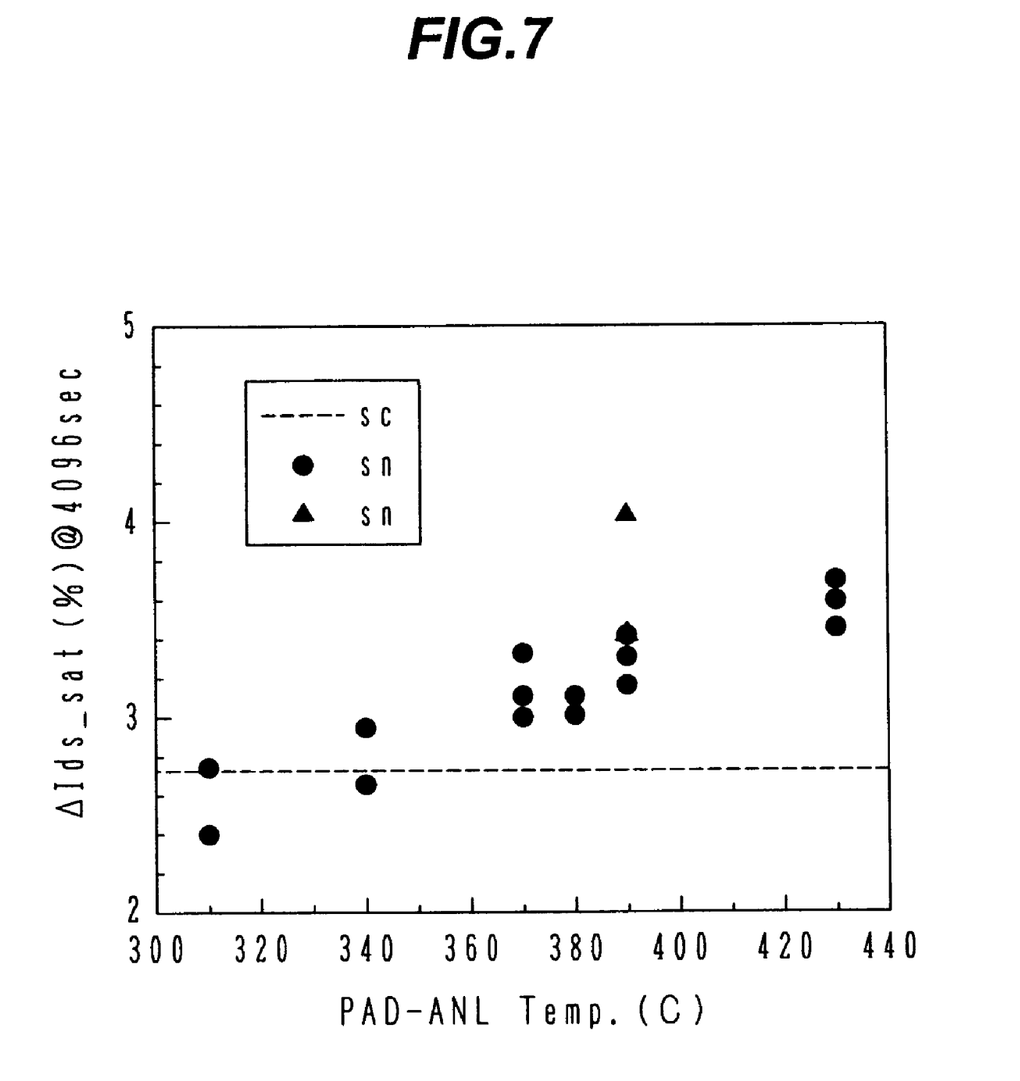
FIG. 7 is a graph showing experiment results.

FIG. 7 is a graph showing a change in NBTI deterioration by a heat treatment after the diffusion prevention layer is formed. A broken line shows the measurement results of the structure having an SiC layer as the diffusion prevention insulating layer. NBTI deterioration does not increase if the SiC layer is used as the diffusion prevention layer, at any annealing temperature of the succeeding heat treatment. It can be seen that NBTI deterioration of the sample sn having an SiN layer as the diffusion prevention layer increases at an annealing temperature of about 340° C. or higher. NBTI deterioration is inevitable if a heat treatment at a temperature of 340° C. or higher, or particularly at a temperature of 370° C. or higher, is performed after the diffusion prevention insulating layer of SiN is formed.

Figure 8A:
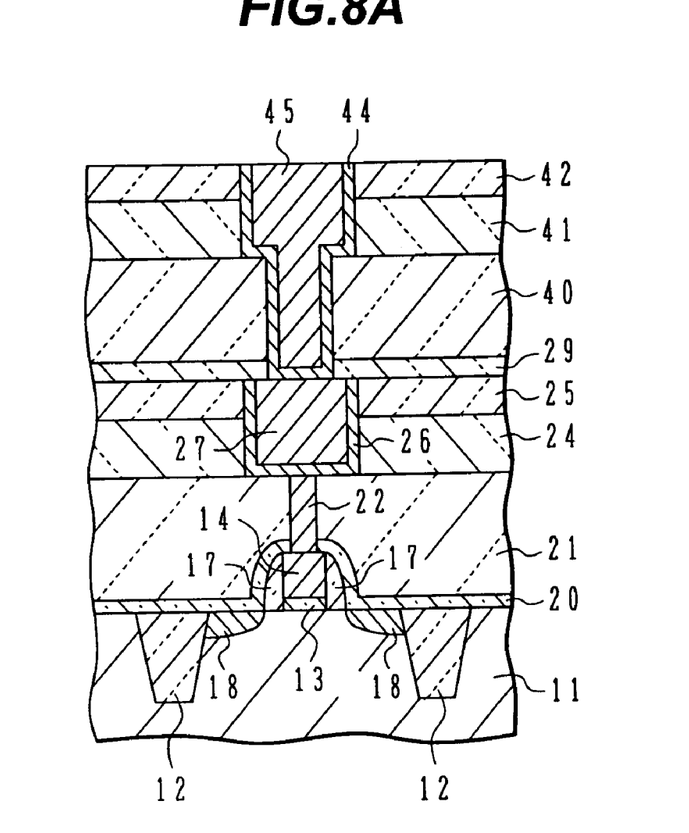
FIGS. 8A and 8B are schematic cross sectional views showing the structure of a semiconductor device according to an embodiment.
Figure 8B:
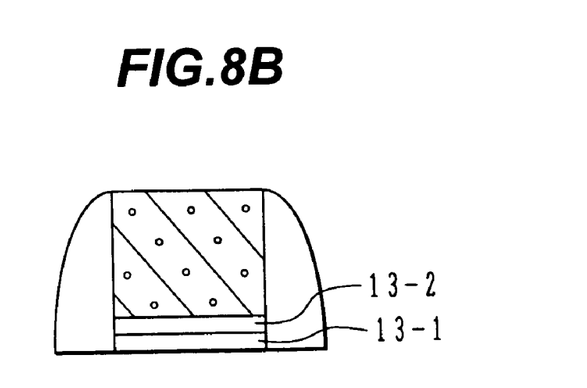

FIGS. 8A and 8B are schematic cross sectional views showing the structure of a semiconductor device designed by considering the experiment results described above. On the surface of a silicon substrate 11, an element isolation trench is formed and an oxide film is buried in this trench to form a shallow trench isolation (STI) 12.

In an active region defined by the shallow trench isolation 12, an insulated gate electrode is formed by a gate insulating film 13 made of a nitrogen-containing oxide film and a silicon gate electrode 14. The side walls of the gate electrode are covered with side wall spacers 17 made of a single silicon oxide layer.

An etch stopper layer 20 of SiN is formed covering the gate electrode and side wall spacers. An interlayer insulating film 21 of silicon oxide such as phosphosilicate glass is formed covering the etch stopper layer 20. A contact hole is formed reaching the transistor from the surface of the interlayer insulating film 21. A Ti layer, a TiN layer and a W layer are stacked and unnecessary portions are removed by CMP to leave a conductive tungsten plug 22.

A laminated insulating layer of an organic low dielectric constant insulating (trade mark SiLK) layer 24 and a silicon oxide layer 25 of USG or the like is formed on the interlayer insulating film 21. A trench is formed through this laminated insulating layer 25, 24. A barrier metal layer 26 of TaN or the like and a Cu wiring layer 27 are filled in the trench.

A diffusion prevention insulating layer 29 of SiC is formed covering the Cu wiring layer. On this diffusion prevention insulating layer 29, a laminated interlayer insulating layer is formed including a silicon oxide layer 40, a low dielectric constant insulating (trade mark SiLK) layer 41 and a silicon oxide layer 42. A trench and a via hole of a dual damascene structure are formed through the interlayer insulating layer. A barrier metal layer 44 of TaN or the like and a Cu wiring layer 45 are filled in the trench and via hole.

NBTI deterioration and drain current deterioration ΔIds can be suppressed by using the SiC layer as the diffusion prevention layer 29.

As shown in FIG. 8B, the gate insulating film may have a lamination structure of a first gate insulating film 13-1 and a second gate insulating film 13-2. For example, the first gate insulating film 13-1 of the lamination structure is made of a silicon oxide film and the second gate insulating film 13-2 is made of a silicon nitride film, hafnium oxide (HfO$_2$) or the like having a high dielectric constant. The lamination structure may be formed by first depositing a silicon oxide layer or a silicon nitride layer and then nitridizing the surface of this layer. This lamination structure is made of the second silicon oxynitride layer 13-2 having a high nitrogen concentration and the first silicon oxynitride layer having a lower nitrogen concentration or silicon oxide layer 13-1.

NBTI deterioration is a phenomenon specific to p-channel MOS transistors. In a CMOS circuit, n- and p-channel MOS transistors are formed by using, some common processes. Processes of manufacturing a CMOS circuit will be described.

Figure 9A:
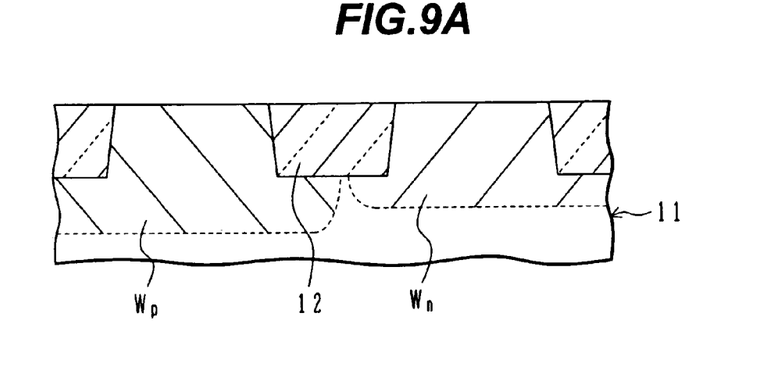
FIGS. 9A to 9F are schematic cross sectional views illustrating processes of a semiconductor device manufacture method according to an embodiment.

As shown in FIG. 9A, a trench is formed in the surface layer of a silicon substrate 11, and a silicon oxide layer is buried in the trench to form a shallow trench isolation 12. A LOCOS layer may be used as the element isolation region. Ions are implanted to form an n-well Wn and a p-well Wp in desired regions.

Figure 9B:
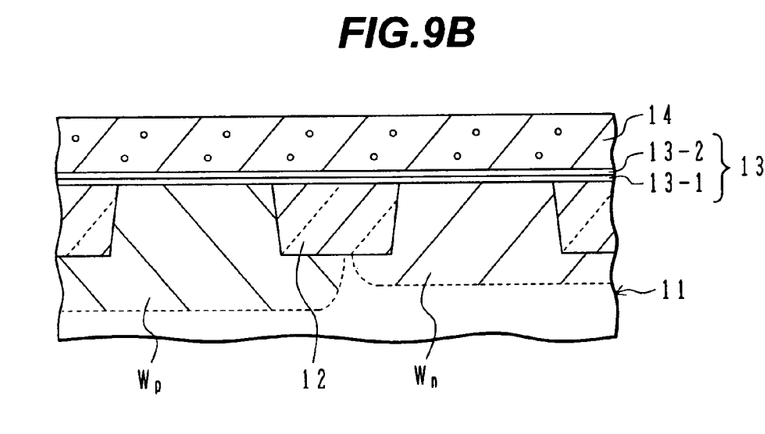

As shown in FIG. 9B, on the surface of the semiconductor substrate, a first gate insulating layer 13-1 and a second gate insulating layer 13-2 are formed to deposit a gate insulating layer 13. If the first gate insulating layer 13-1 is made of silicon oxide, this layer 13-1 can be formed by thermal oxidation. The second gate insulating layer 13-2 is an insulating layer different from the first gate insulating layer formed by CVD or the like. The second gate insulating layer 13-2 may be formed through a nitridation process. A polysilicon layer 14 is deposited on the gate insulating layer 13 by CVD.

Figure 9C:
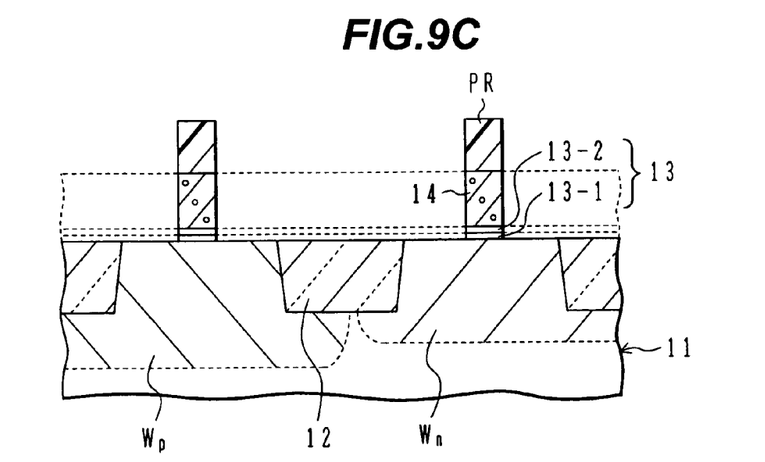

As shown in FIG. 9C, a photoresist pattern PR is formed on the polysilicon layer 14 to etch the polysilicon layer 14 and gate insulating layer 13. After this etching, the photoresist pattern PR is removed. By using a resist pattern and gate electrode as a mask, ions are implanted independently into the p-well Wp and n-well Wn to form LDD regions.

Figure 9D:
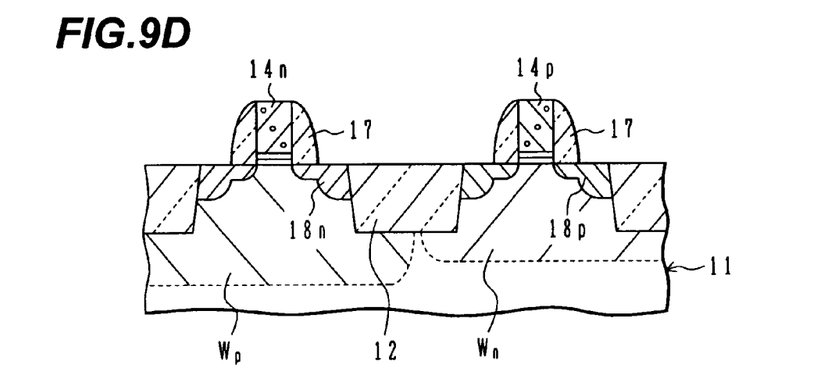

As shown in FIG. 9D, a silicon oxide film is deposited and anisotropically etched to leave side wall spacers 17 on the side walls of the insulated gate electrode. Thereafter, ions are implanted independently into the n-well Wn and p-well Wp to form source/drain regions 18$p$ and 18$n$ of a high impurity concentration. This ion implantation also dopes impurities into the polysilicon gate electrode 14 to form a p-type polysilicon gate electrode 14$p$ and an n-type polysilicon gate electrode 14$n$.

Figure 9E:
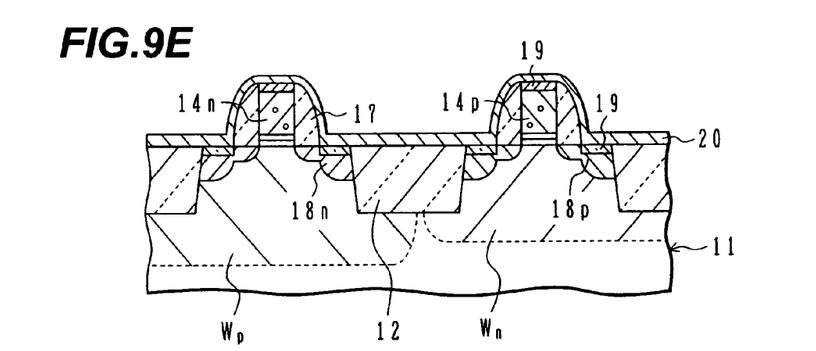

As shown in FIG. 9E, for example, a Co layer is deposited on the exposed substrate surface and a heat treatment is performed to form silicide layers 19 on the silicon layer surface. Unreacted metal layers are removed. An etch stopper layer 20 of SiN is deposited on the whole substrate surface by CVD.

Figure 9F:
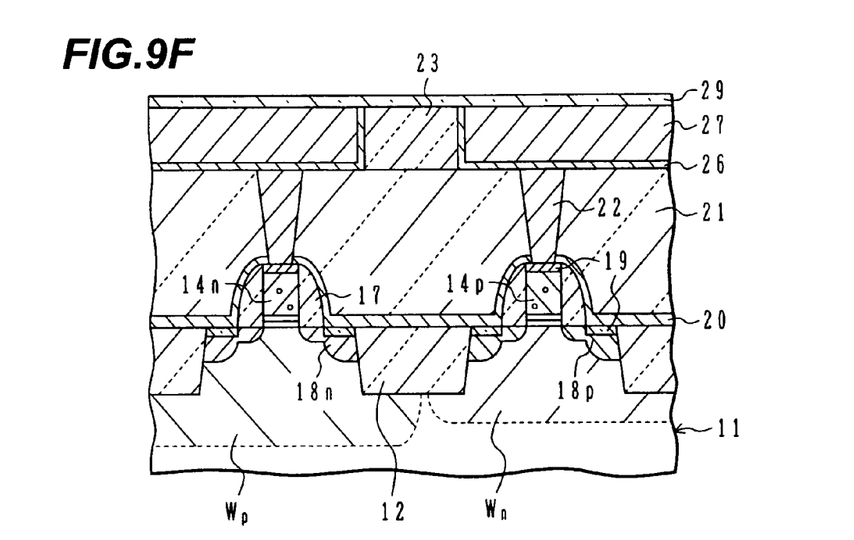

As shown in FIG. 9F, an interlayer insulating layer 21 of, e.g., phosphosilicate glass, is formed covering the etch stopper layer 20, and the surface of the interlayer insulating layer 21 is planarized. From the surface of the interlayer insulating layer 21, a contact hole is formed through this layer and a barrier metal layer and a W layer are filled in this contact hole to form a conductive plug 22. The metal layers on the surface of the interlayer insulating layer 21 are removed, and an upper insulating layer 23 is formed. A trench is formed in the insulating layer 23, and a barrier metal layer 26 and a Cu wiring layer 27 are deposited to form Cu wiring. After the metal layers on the surface of the interlayer insulating layer 23 are removed, a Cu diffusion prevention insulating layer 29 of SiC is formed. A desired number of upper wiring layers may be formed.

The present invention has been described in connection with the preferred embodiments. The invention is not limited only to the above embodiments. For example, Cu wiring may be either a single or double damascene structure. Various known damascene structures may be adopted. In the above description, although a first wiring layer is made of a conductive plug of W or the like and a Cu wiring layer, a Cu wiring layer of a double damascene structure may be formed by forming a trench and a via hole in the interlayer insulating film. In the above description, although the Cu diffusion prevention layer, is formed on the Cu wiring layer, the Cu diffusion prevention insulating layer may be formed on the lower surface of the Cu wiring layer. It will be apparent to those skilled in the art that various modifications, improvements, combinations, and the like can be made.

We claim is:

1. A semiconductor device comprising:
    a silicon substrate having an n-type region;
    a gate insulating film formed on the n-type region, using nitrogen-containing silicon oxide;
    a gate electrode formed on said gate insulating film, said gate electrode comprising boron-containing silicon;
    p-type source/drain regions formed in a surface layer of said silicon substrate on both sides of said gate electrode;
    side wall spacers formed on side walls of said gate electrode, said side wall spacer comprising a lamination of a silicon oxide layer and a silicon nitride layer;
    a lower interlayer insulating film having a planarized surface and covering said gate electrode and side wall spacers;
    an intermediate interlayer insulating film formed above said lower interlayer insulating film, and having a planarized surface:
    a wiring trench formed in said interlayer insulating film from the planarized surface to an inside thereof; and
    a copper wiring pattern including an underlying barrier layer of Ta or Ti formed on inner surfaces of the wiring trench, and an upper level copper region formed on the underlying barrier layer, said copper wiring pattern being filled in said wiring trench, while being separated from the lower and intermediate interlayer insulating film.

2. A semiconductor device according to claim 1, further comprising a copper-diffusion-preventing insulator layer formed on said copper wiring pattern and said interlayer insulating film.

3. A semiconductor device according to claim 2, wherein said copper-diffusion-preventing insulator layer is made of silicon nitride.

4. A semiconductor device according to claim 3, wherein said silicon nitride is formed by plasma-enhanced CVD using silane and ammonia as source gases.

5. A semiconductor device according to claim 4, wherein said plasma-enhanced CVD is carried out with significantly reduced silane flow rate compared to standard condition.

6. A semiconductor device according to claim 1, further comprising:
    a via hole penetrating through said lower interlayer insulating film; and a conductive plug filled in the via hole,
wherein said copper wiring is connected to said conductive plug at a bottom thereof.

7. A semiconductor device according to claim 6, wherein said conductive plug comprises a lamination structure of a barrier metal and a tungsten layer.

8. A semiconductor device according to claim 1, wherein said silicon nitride layer of said side wall spacer is formed on the side wall of the gate electrode, and said silicon oxide layer is formed thereon.

9. A semiconductor device comprising:
a silicon substrate having an n-type region;
a gate insulating film formed on the n-type region, using nitrogen-containing silicon oxide;
a gate electrode formed on said gate insulating film, said gate electrode comprising boron-containing silicon;
p-type source/drain regions formed in a surface layer of said silicon substrate on both sides of said gate electrode;
side wall spacers formed on side walls of said gate electrode, said side wall spacer comprising a lamination of an upper silicon oxide layer and a lower silicon nitride layer;
a lower interlayer insulating film having a planarized surface and covering said gate electrode and side wall spacers;
conductive plugs penetrating through the lower interlayer insulating film;
an intermediate interlayer insulating film formed above said lower interlayer insulating film, and having a planarized surface;
a wiring trench formed in said interlayer insulating film from the planarized surface to expose one of said conductive plugs;
a copper wiring pattern including an underlying barrier layer of Ta or Ti formed on inner surfaces of the wiring trench, and an upper level copper region formed on the underlying barrier layer, said copper wiring pattern having a planarized surface, and being filled in said wiring trench, while being separated from the lower and intermediate interlayer insulating film; and
a copper-diffusion-preventing insulator layer made of silicon nitride, and formed on said copper wiring pattern and said interlayer insulating film.

10. A semiconductor device according to claim 9, wherein said underlying barrier layer is formed of Ta.

* * * * *